(12) United States Patent
Pant et al.

(10) Patent No.: US 10,109,619 B2
(45) Date of Patent: Oct. 23, 2018

(54) METHODS AND APPARATUS FOR USING SPLIT N-WELL CELLS IN A MERGED N-WELL BLOCK

(71) Applicant: QUALCOMM Incorporated, San Diego, CA (US)

(72) Inventors: Harshat Pant, San Diego, CA (US); Mohammed Yousuff Shariff, San Diego, CA (US); Parissa Najdesamii, San Diego, CA (US); Ramaprasath Vilangudipitchai, San Diego, CA (US); Divjyot Bhan, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 214 days.

(21) Appl. No.: 15/174,684

(22) Filed: Jun. 6, 2016

(65) Prior Publication Data
US 2017/0352649 A1 Dec. 7, 2017

(51) Int. Cl.
H01L 23/538 (2006.01)
H01L 27/02 (2006.01)
H01L 23/535 (2006.01)
H01L 27/088 (2006.01)
G06F 17/50 (2006.01)
H01L 21/8238 (2006.01)

(52) U.S. Cl.
CPC ...... H01L 27/0207 (2013.01); G06F 17/5068 (2013.01); G06F 17/5072 (2013.01); H01L 23/535 (2013.01); H01L 27/0886 (2013.01); H01L 21/823892 (2013.01)

(58) Field of Classification Search
CPC . H01J 27/0207; H01L 23/535; H01L 27/0886

USPC ......................................................... 327/566
See application file for complete search history.

(56) References Cited

U.S. PATENT DOCUMENTS

| 5,920,089 | A |  | 7/1999 | Kanazawa et al. |
| 6,768,144 | B2 | * | 7/2004 | Houston ............. H01L 27/1104 257/204 |
| 6,818,929 | B2 |  | 11/2004 | Tsutsumi et al. |
| 7,095,063 | B2 | * | 8/2006 | Cohn ................ H01L 27/11803 257/207 |
| 8,487,658 | B2 |  | 7/2013 | Datta et al. |
| 9,483,600 | B2 | * | 11/2016 | Bansal ................ H01L 27/0207 |
| 2006/0291110 | A1 |  | 12/2006 | Kanno et al. |

(Continued)

OTHER PUBLICATIONS

International Search Report and Written Opinion—PCT/US2017/024801—ISA/EPO—dated Jun. 14, 2017.

Primary Examiner — Dinh T Le
(74) Attorney, Agent, or Firm — Arent Fox, LLP

(57) ABSTRACT

In an aspect of the disclosure, a MOS device for reducing routing congestion caused by using split n-well cells in a merged n-well circuit block is provided. The MOS device may include a first set of cells adjacent to each other in a first direction. The MOS device may include a second set of cells adjacent to each other in the first direction and adjacent to the first set of cells in a second direction. The second set of cells each may include a first n-well, a second n-well, and a third n-well separated from each other. The MOS device may include an interconnect extending in the first direction in the second set of cells. The interconnect may provide a voltage source to the first n-well of each of the second set of cells.

24 Claims, 9 Drawing Sheets

(56) References Cited

U.S. PATENT DOCUMENTS

2010/0308667 A1 12/2010 Sakurabayashi
2015/0262936 A1 9/2015 Bansal et al.

\* cited by examiner

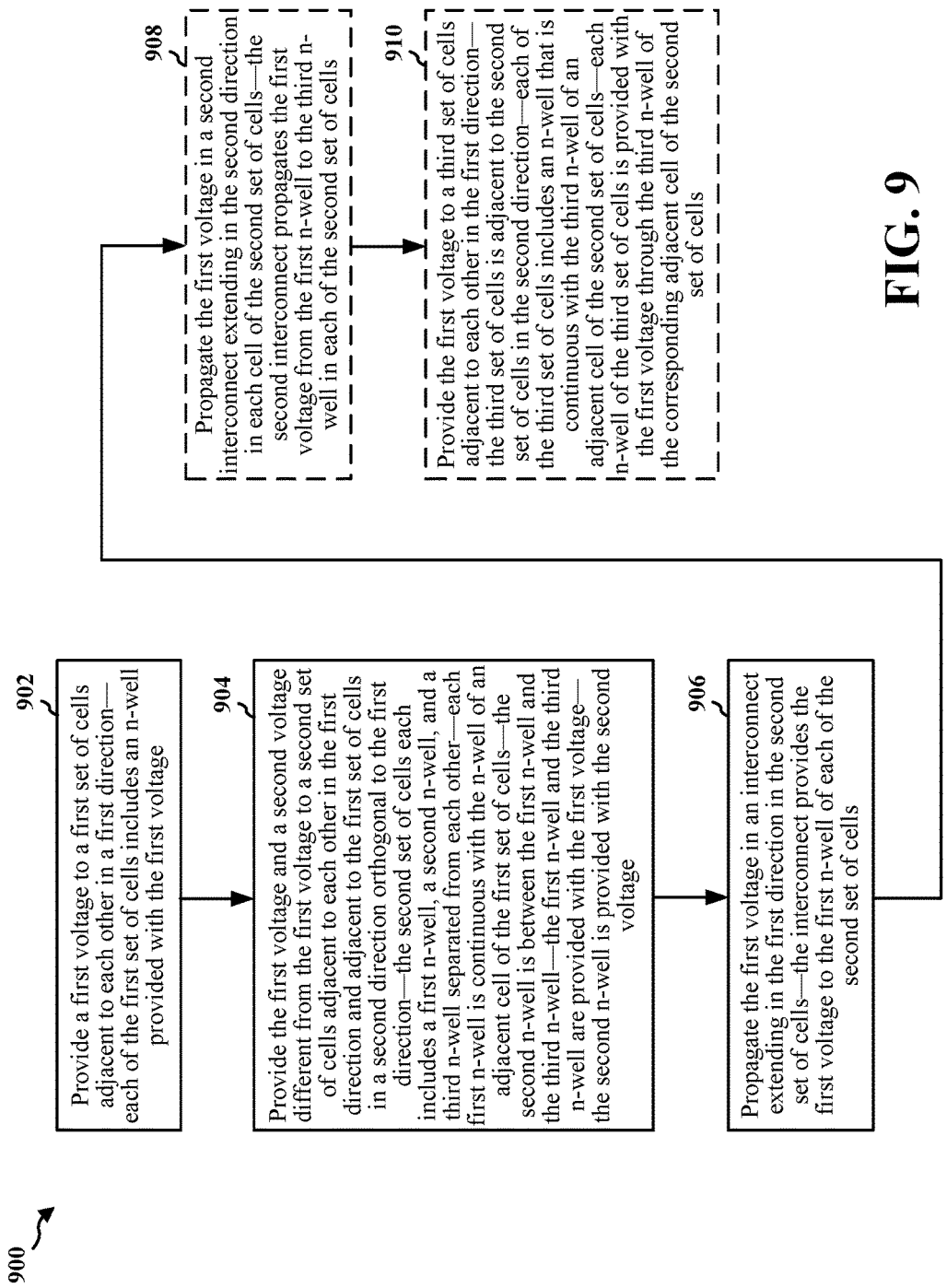

METHODS AND APPARATUS FOR USING SPLIT N-WELL CELLS IN A MERGED N-WELL BLOCK

BACKGROUND

Field

The present disclosure relates generally to semiconductor design, and more particularly, to circuits and layout construction.

Background

Integrated circuit (IC) devices may contain functional circuits that handle multiple voltage levels. Such devices are often known as multi-voltage level devices, and such functional circuits may be referred to as multi-voltage circuits. Multi-voltage circuits may include but are not limited to always on (AON) buffers/inverters, isolation cell, switches, level shifters, retention registers, etc. Because multi-voltage circuits handle multiple voltage levels, some cells in a multi-voltage circuit may have split n-type wells (n-wells) and multiple routes for supplying multiple voltages levels.

A merged n-well is a continuous n-well that is shared by several transistors of one or more cells. Usage of a merged n-well in a circuit block may provide significant area saving opportunities, and thus may be popular in the design of advanced circuits. However, an IC may also contain multi-voltage circuits with split n-well cells. Improvements to architectures utilizing split n-well cells in a merged n-well circuit block in a manner that does not cause area overhead or routing congestion, thus making the design manufacturable, may be desirable.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

A merged n-well circuit block may contain a large number of split n-well cells. Each split n-well cell may need to be routed to an AON voltage source, causing routing congestion, even making the design of the merged n-well circuit block difficult or impossible to be manufactured.

In an aspect of the disclosure, a metal oxide semiconductor (MOS) device is provided. The MOS device may include a first set of cells adjacent to each other in a first direction. Each of the first set of cells may include an n-well coupled to a first voltage source. The MOS device may include a second set of cells adjacent to each other in the first direction and adjacent to the first set of cells in a second direction orthogonal to the first direction. The second set of cells each may include a first n-well, a second n-well, and a third n-well separated from each other. Each first n-well may be continuous with the n-well of an adjacent cell of the first set of cells. The second n-well may be between the first n-well and the third n-well. The first n-well and the third n-well may be coupled to the first voltage source. The second n-well may be coupled to a second voltage source different than the first voltage source. The MOS device may include an interconnect extending in the first direction in the second set of cells. The interconnect may provide the first voltage source to the first n-well of each of the second set of cells.

In another aspect of the disclosure, a method and an apparatus for operating a MOS device are provided. The apparatus may provide a first voltage to a first set of cells adjacent to each other in a first direction. Each of the first set of cells may include an n-well provided with the first voltage. The apparatus may provide the first voltage and a second voltage different from the first voltage to a second set of cells adjacent to each other in the first direction and adjacent to the first set of cells in a second direction orthogonal to the first direction. The second set of cells each may include a first n-well, a second n-well, and a third n-well separated from each other. Each first n-well may be continuous with the n-well of an adjacent cell of the first set of cells. The second n-well may be between the first n-well and the third n-well. The first n-well and the third n-well may be provided with the first voltage. The second n-well may be provided with the second voltage. The apparatus may propagate the first voltage in an interconnect extending in the first direction in the second set of cells. The interconnect may provide the first voltage to the first n-well of each of the second set of cells.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIG. 9 is a flowchart of a method of operating a MOS device.

DETAILED DESCRIPTION

Figure 1:
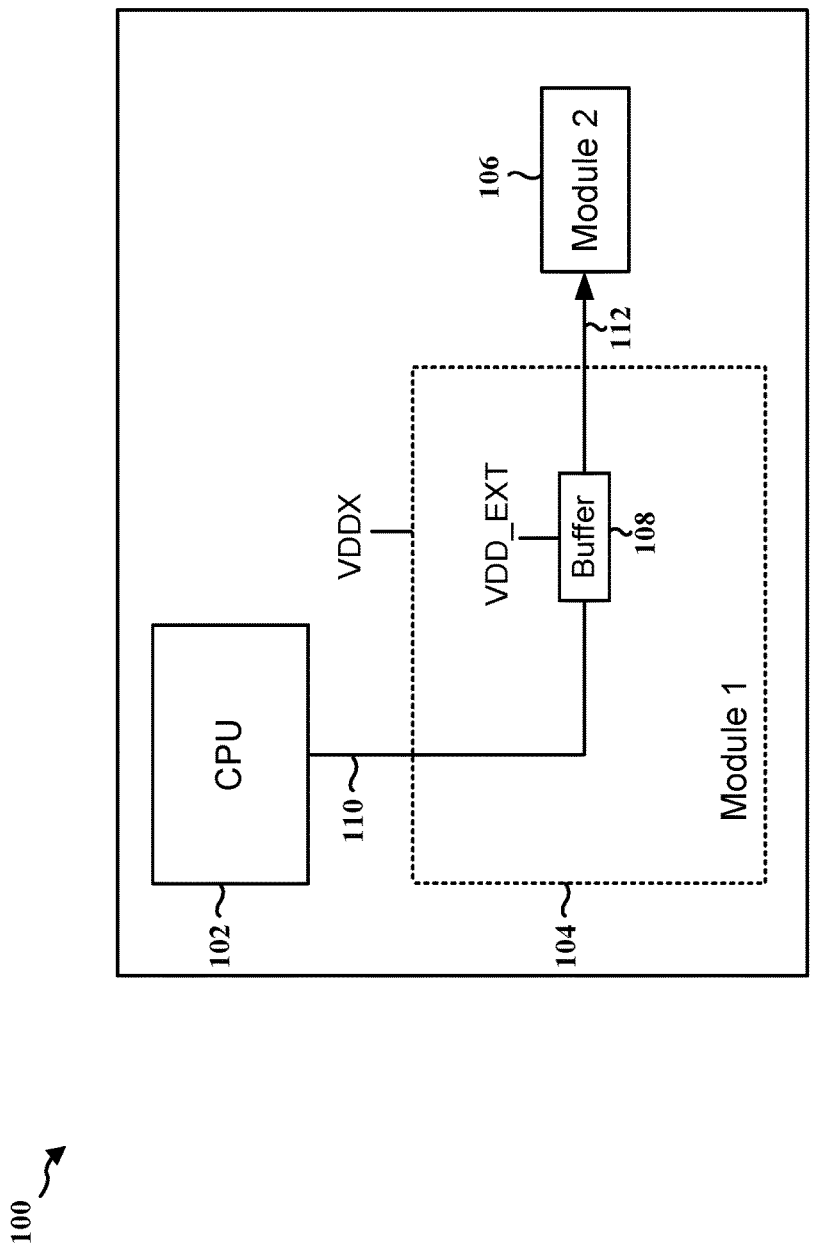
FIG. 1 is a diagram illustrating an example semiconductor die in accordance with various aspects of the disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example semiconductor die 100 in accordance with various aspects of the disclosure. As shown in FIG. 1, semiconductor die 100 includes a central processing unit (CPU) 102, a first module 104, a second module 106, and a buffer 108. In FIG. 1, a first transmission line 110 is routed from the CPU 102 to an input of the buffer 108, and a second transmission line 112 is routed from the output of the buffer 108 to the second module 106. The buffer 108 may serve to increase the strength of a signal transmitted by the CPU 102 to the second module 106 in order to ensure that the signal is successfully received by the second module 106.

As shown in FIG. 1, a portion of the first transmission line 110, the buffer 108, and a portion of the second transmission line 112 are situated in a region (indicated with dotted lines in FIG. 1) of the semiconductor die 100 in which the layout of the first module 104 is configured. The first module 104 is powered by a first voltage source (e.g., "VDDX"), and the buffer 108 is powered by a second voltage source (e.g., "VDD_EXT") that may be independent of (and/or different than) the first voltage source. Therefore, during periods when the first voltage source is powered down (e.g., when the first module 104 is not in use) to conserve an energy supply of the semiconductor die 100, the second voltage source may remain on to continue supplying power to the buffer 108. As such, signals from the CPU to the second module 106 may be strengthened by the buffer 108 during periods when the first voltage source is powered down.

Figures 2A, 2B:
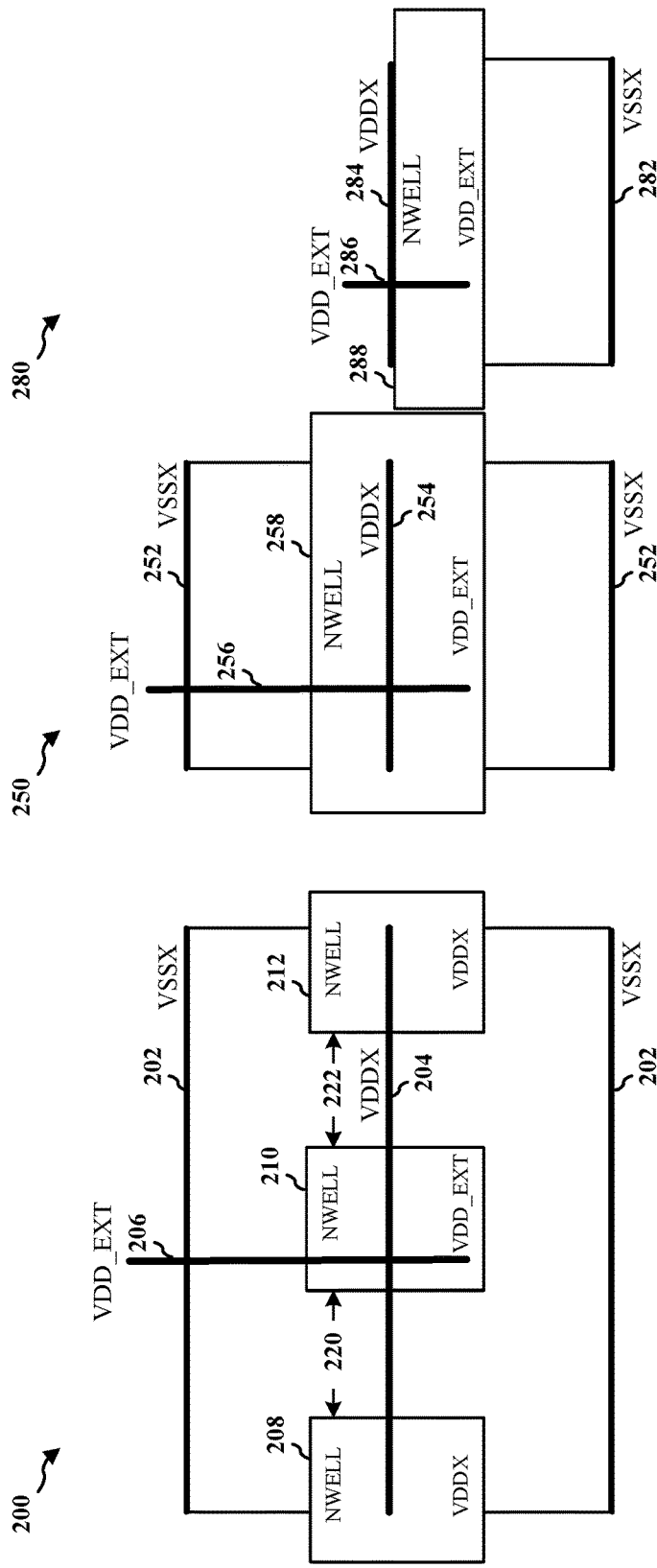
FIG. 2A is a diagram illustrating a layout view of a double height split n-well cell.
FIG. 2B is a diagram illustrating a layout view of a double height merged n-well cell and single height merged n-well cell.

FIG. 2A is a diagram illustrating a layout view of a double height split n-well cell 200. As illustrated in FIG. 2A, the split n-well cell 200 includes three separate n-wells 208, 210, and 212. The n-wells 208 and 210 are separated by a spacing 220, and the n-wells 210 and 212 are separated by a spacing 222. Two power rails 202 extend horizontally across the split n-well cell 200 along the top edge and bottom edge of the cell 200. The power rails 202 may provide power to the cell 200 from a first voltage source (e.g., VSSX). A power rail 204 extends horizontally across the split n-well cell 200. The power rail 204 may provide power to the n-wells 208 and 212 from a second voltage source (e.g., VDDX). The second voltage source may have a higher voltage level than the first voltage source. A power rail 206 extends vertically to provide power to the n-well 210 from a third voltage source (e.g., VDD_EXT). The third voltage source may have a different voltage level than the second voltage source. The third voltage source may have a higher voltage level than the first voltage source.

FIG. 2B is a diagram illustrating a layout view of a double height merged n-well cell 250 and single height merged n-well cell 280. As illustrated in FIG. 2B, the double height merged n-well cell 250 includes a merged n-well 258. Because of the merged n-well 258, the spacing between different n-wells is eliminated. Two power rails 252 extend horizontally across the merged n-well cell 250 along the top edge and bottom edge of the cell 250. The power rails 252 may provide power to the cell 250 from a first voltage source (e.g., VSSX, which may be ground). A power rail 254 extends horizontally across the merged n-well cell 250. The power rail 254 may provide power to the cell 250 from a second voltage source (e.g., VDDX). The second voltage source may have a higher voltage level than the first voltage source. A power rail 256 extends vertically to provide power to the merged n-well 258 from a third voltage source (e.g., VDD_EXT). The third voltage source may have a different voltage level than the second voltage source. The third voltage source may have a higher voltage level than the first voltage source.

The single height merged n-well cell 280 includes a merged n-well 288. Because of the merged n-well 288, the spacing between different n-wells is eliminated. A power rail 282 extends horizontally across the merged n-well cell 280 along the bottom edge of the cell 280. The power rails 282 may provide power to the cell 280 from a first voltage source (e.g., VSSX). A power rail 284 extends horizontally across the merged n-well cell 250. The power rail 284 may provide power to the cell 280 from a second voltage source (e.g., VDDX). The second voltage source may have a higher voltage level than the first voltage source. A power rail 286 extends vertically to provide power to the merged n-well 288 from a third voltage source (e.g., VDD_EXT). The third voltage source may have a different voltage level than the second voltage source. The third voltage source may have a higher voltage level than the first voltage source. Compared to the split n-well cell 200 that provides different voltage levels (e.g., VDDX and VDD_EXT) for different n-wells, the double height merged n-well cell 250 and the single height merged n-well cell 280 provide a single voltage level (e.g., VDD_EXT) to the merged n-wells 258 and 288, respectively.

As shown in FIGS. 2A and 2B, merged n-well cells (e.g., the cell 250) may be significantly smaller than the split n-well counterparts (e.g., the cell 200). The area shrinkage is achieved through elimination of spacing (e.g., 220 and 222) between separate n-wells. In one configuration, merged n-well cells may bring power grid savings because merged n-well power management cells, e.g., head-switch cells, may have more driving capability. In one configuration, merged n-well cells may allow for floorplan optimizations because top level channels may be avoided by routing signals through merged n-well blocks using always on buffers without having a large area penalty.

Figure 3:
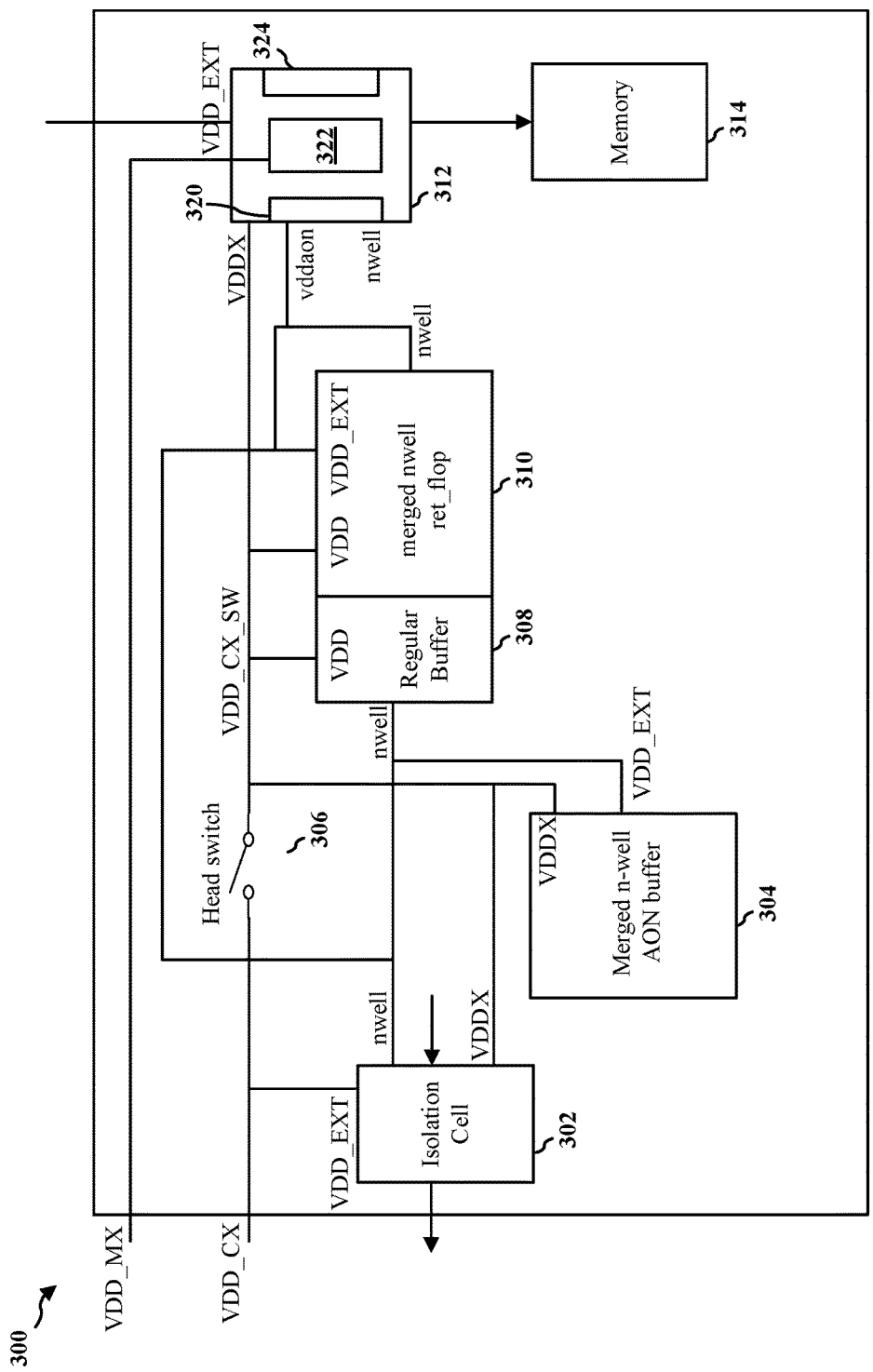
FIG. 3 is a diagram illustrating a logical view of an example of using split n-well cells in a merged n-well circuit block.

FIG. 3 is a diagram illustrating a logical view of an example of using split n-well cells in a merged n-well circuit block 300. In this example, the merged n-well circuit block 300 includes a merged n-well isolation cell 302, an merged n-well AON buffer 304 for signals in a first power domain (e.g., VDD_CX), a head switch 306, a regular buffer 308, a rising-edge triggered (RET) flop 310 with a merged n-well, a split n-well AON buffer 312 with split n-wells for signals in a second power domain (e.g., VDD_MX), and a memory 314.

The head switch 306 is coupled to the first power domain (e.g., VDD_CX) and performs power gating for circuits in the first power domain. The head switch 306 outputs a switchable version (e.g., VDD_CX_SW) of the first power domain. When circuits in the first power domain are not in use, the head switch 306 may shut off the switchable version of the first power domain to conserve power. An AON version of the first power domain is provided to circuits like AON buffers 304 and 312 to maintain their continuous operations. In one configuration, the AON version of the first power domain is provided by the first power domain (e.g., VDD_CX) without going through the head switch 306.

In the merged n-well circuit block 300, a merged n-well is shared by circuits such as the regular buffer 308 and the RET flop 310. In one configuration, the AON version of the first power domain is coupled to the merged n-well. In one configuration, tapping of the n-well may be done using a tap-cell to connect the n-well to the AON version of the first power domain.

However, cells like the split n-well AON buffer 312 may be additionally powered by a second power domain (e.g., VDD_MX) that has a different voltage level than the first power domain in order to route signals to the memory 314. As a result, the split n-well AON buffer 312 may have separated n-wells 320, 322, and 324 because a merged n-well cannot be coupled to two different voltage levels. In one configuration, the n-wells 320 and 324 may be coupled to the AON version of the first power domain and the n-well 322 may be coupled to the second power domain. In one configuration, in order to couple the n-well 320 to the AON version of the first power domain, an extra power pin (e.g., VDDAON) may be added for the n-well 320. In such a configuration, the n-well 320 is shorted to the VDDAON pin and the AON version of the first power domain (e.g., VDD_CX) may be routed to the VDDAON pin, so that the n-well 320 is coupled to the AON version of the first power domain. Because there may be a large number of split n-well cells in the merged n-well circuit block 300 and each of the split n-well cells may need to be routed to the AON version of the first power domain, routing congestion may occur, thus making the design of the merged n-well circuit block 300 difficult or impossible to be manufactured.

In the example of FIG. 3, an AON buffer with split n-well is used in the merged n-well circuit block 300. However, one of ordinary skill in the art would recognize that other cells that cannot be made merged n-well (e.g., AON inverters, isolation cell, switches, level shifters, rendition registers, etc.) may be used in the merged n-well circuit block 300. Therefore, the challenge is to integrate these split n-well cells gracefully in the merged n-well circuit block (e.g., 300) without causing area loss, without causing routing congestion, and without causing latch-up issues.

Figure 4:
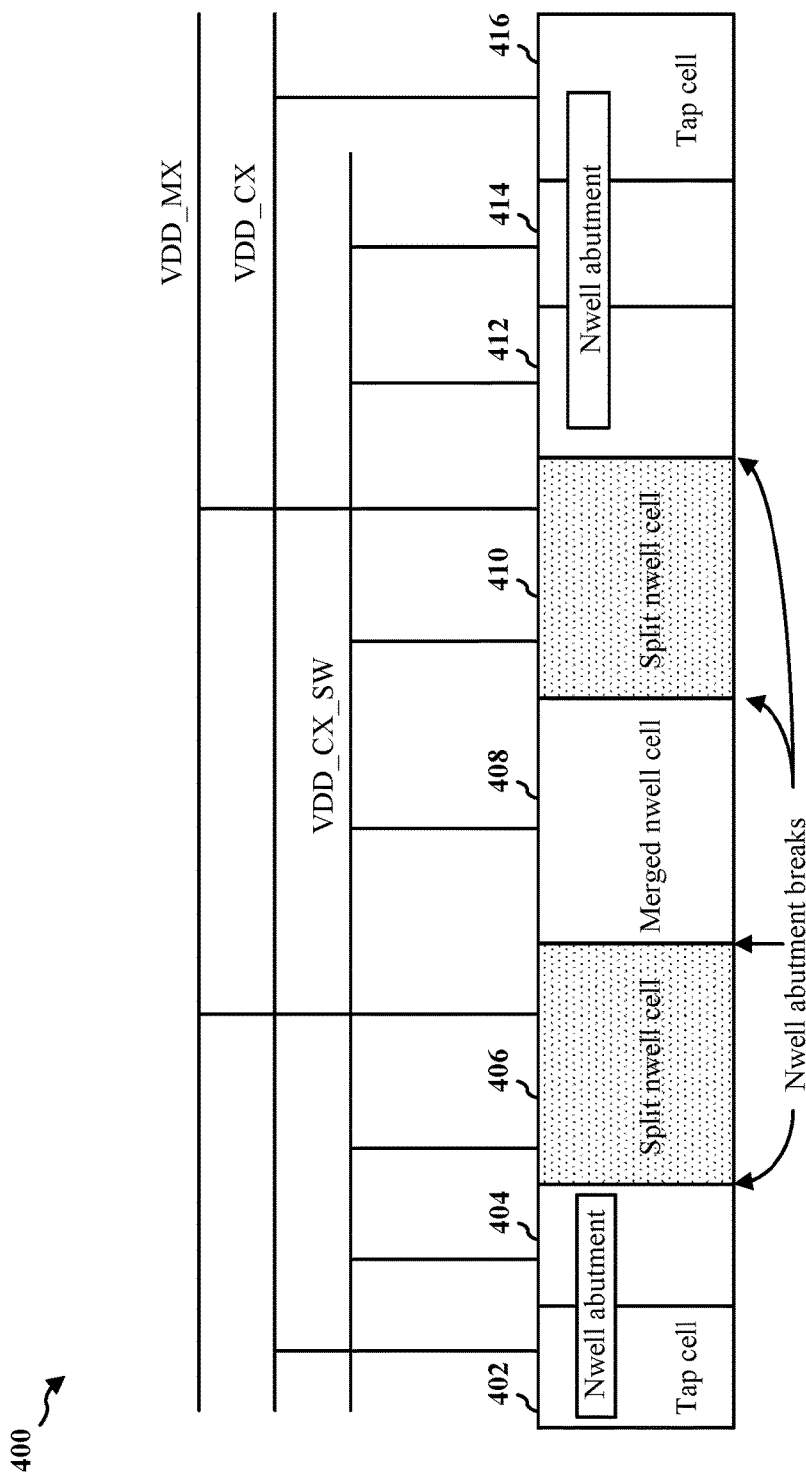
FIG. 4 is a diagram illustrating an implementation example of mixing split n-well cells in a merged n-well circuit block.

FIG. 4 is a diagram illustrating an implementation example of mixing split n-well cells in a merged n-well circuit block 400. In this example, the merged n-well circuit block 400 includes tap cells 402, 416, merged n-well cells 404, 408, 412, 414, and split n-well cells 406, 410.

The tap cells 402 and 416 are located at the left side and right side of the merged n-well circuit block 400, respectively. Each of the tap cells 402 and 416 connects its n-well to a first voltage source (e.g., VDD_CX). Because the merged n-well cell 404 is adjacent to the tap cell 402, the n-well of the merged n-well cell 404 abuts the n-well of the tap cell 402 to form a merged n-well. Similarly, because the merged n-well cell 412 is adjacent to the merged n-well cell 414, which is adjacent to the tap cell 402, the n-well of the merged n-well cell 412 abuts the n-well of the merged n-well cell 414, which abuts the n-well of the tap cell 416. Therefore, the n-wells of the cells 412, 414, and 416 form a merged n-well. As illustrated in FIG. 4, the n-well abutment breaks because the split n-well cells 406 and 410 are placed between the merged n-well cells.

Each of the merged n-well cells 404, 408, 412, and 414 is internally tapped to a default switchable version (e.g., VDD_CX_SW) of the first voltage source. Similarly, each of the split n-well cells 406 and 410 is internally tapped to the default switchable version of the first voltage source. Each of the split n-well cells 406 and 410 is also internally tapped to a second voltage source (e.g., VDD_MX). The second voltage source may have a different voltage level than the first voltage source.

Because the merged n-well cell 408 is between the split n-well cells 406 and 410, the merged n-well cell 408 is separated from the merged n-wells that are connected to the first voltage source through the tap cells 402 and 416. As a result, the merged n-well cell 408 may need to route the first voltage source to its n-well. There may be a large number of split n-well cells in the merged n-well circuit block 400. Therefore, there may be a large number of merged n-well cells that need a separate route of the first voltage source to their n-wells. Consequently, there may be area loss or routing congestion caused by integrating the split n-well cells into the merged n-well circuit block 400.

The complication comes from the fact that certain cells (e.g., power management cells) cannot be made merged n-well cells. A level shifter is one such split n-well cell that is widely used. Another example is the split n-well AON buffer that routes signal in the non default power domain (e.g., VDD_MX). The challenge is to integrate these split n-well cells gracefully in the merged n-well circuit block (e.g., 400) without causing area loss, without causing routing congestion, and without causing latch-up issues.

Figure 5:
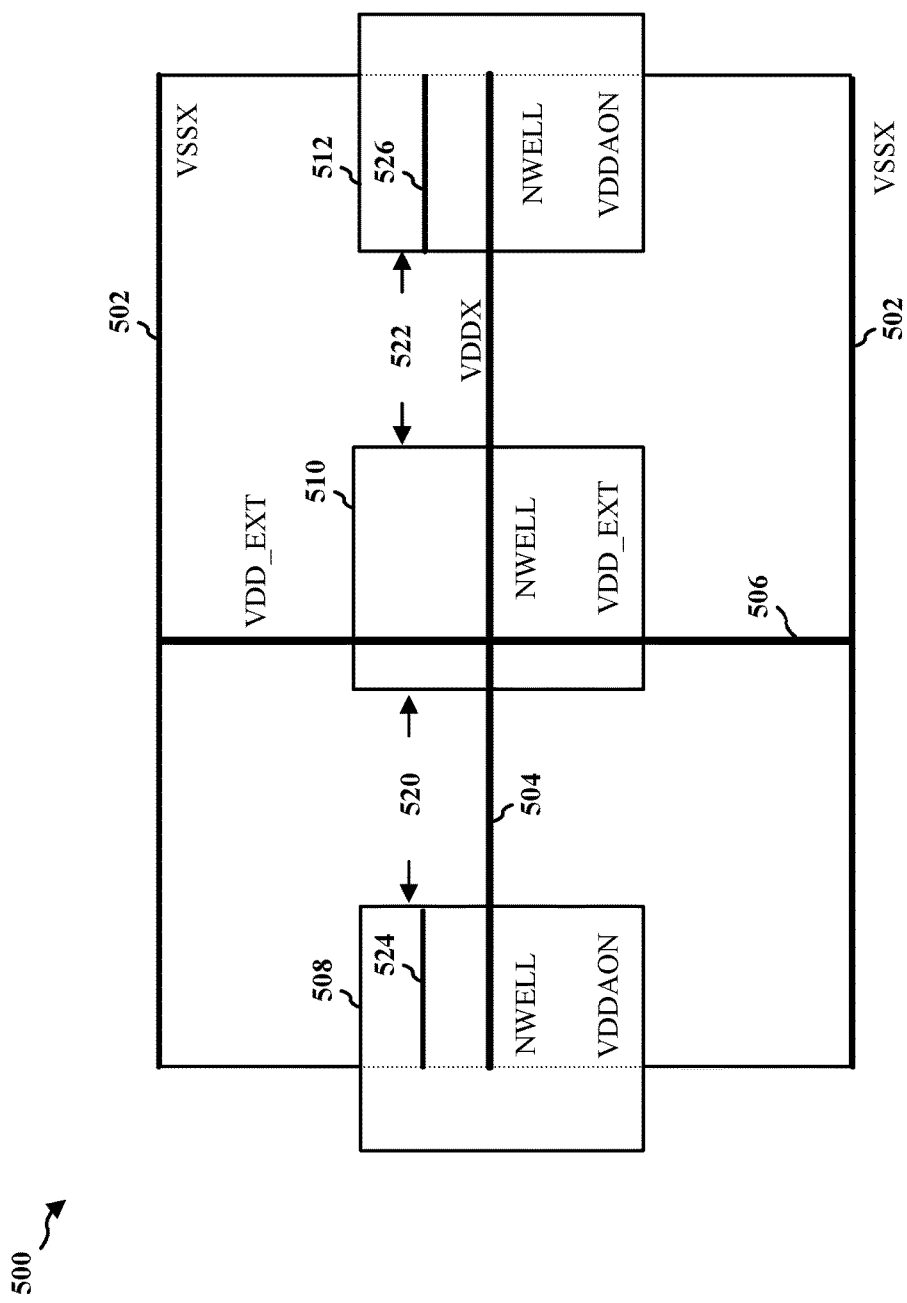
FIG. 5 is a diagram illustrating a layout view of a split n-well cell.

FIG. 5 is a diagram illustrating a layout view of a split n-well cell 500. In one configuration, the split n-well cell 500 may be the split n-well cell 406 or 410 described above with reference to FIG. 4. As illustrated in FIG. 5, the split n-well cell 500 includes three separate n-wells 508, 510, and 512. The n-wells 508 and 510 are separated by a spacing 520, and the n-wells 510 and 512 are separated by a spacing 522.

Two power rails 502 extend horizontally across the split n-well cell 500 along the top edge and bottom edge of the cell 500. The power rails 502 may provide power to the cell 500 from a first voltage source (e.g., VSSX). A power rail 504 extends horizontally across the split n-well cell 500. The power rail 504 may provide power to the cell 500 from a second voltage source (e.g., VDDX). The second voltage source may have a higher voltage level than the first voltage source. In one configuration, the second voltage source may be the default switchable version (e.g., VDD_CX_SW) of an AON voltage source (e.g., VDD_CX) described above with reference to FIGS. 3 and 4. A power rail 506 extends vertically to provide power to the n-well 510 from a third voltage source (e.g., VDD_EXT). The third voltage source may have a different voltage level than the second voltage source. The third voltage source may have a higher voltage level than the first voltage source. In one configuration, the third voltage source may be the non-default voltage source (e.g., VDD_MX) described above with reference to FIGS. 3 and 4.

As illustrated in FIG. 5, the n-well 508 has a power pin 524. Therefore, instead of the n-well 508 being internally tapped to the second voltage source (e.g., VDDX) through the power rail 504, the n-well 508 may tap to an AON voltage source (e.g., VDD_CX) through the power pin 524. In one configuration, the AON voltage source may be an AON version of the second voltage source. Similarly, the n-well 512 has a power pin 526. Therefore, instead of the n-well 512 being internally tapped to the second voltage source through the power rail 504, the n-well 512 may tap to the AON voltage source through the power pin 526.

Figure 6:
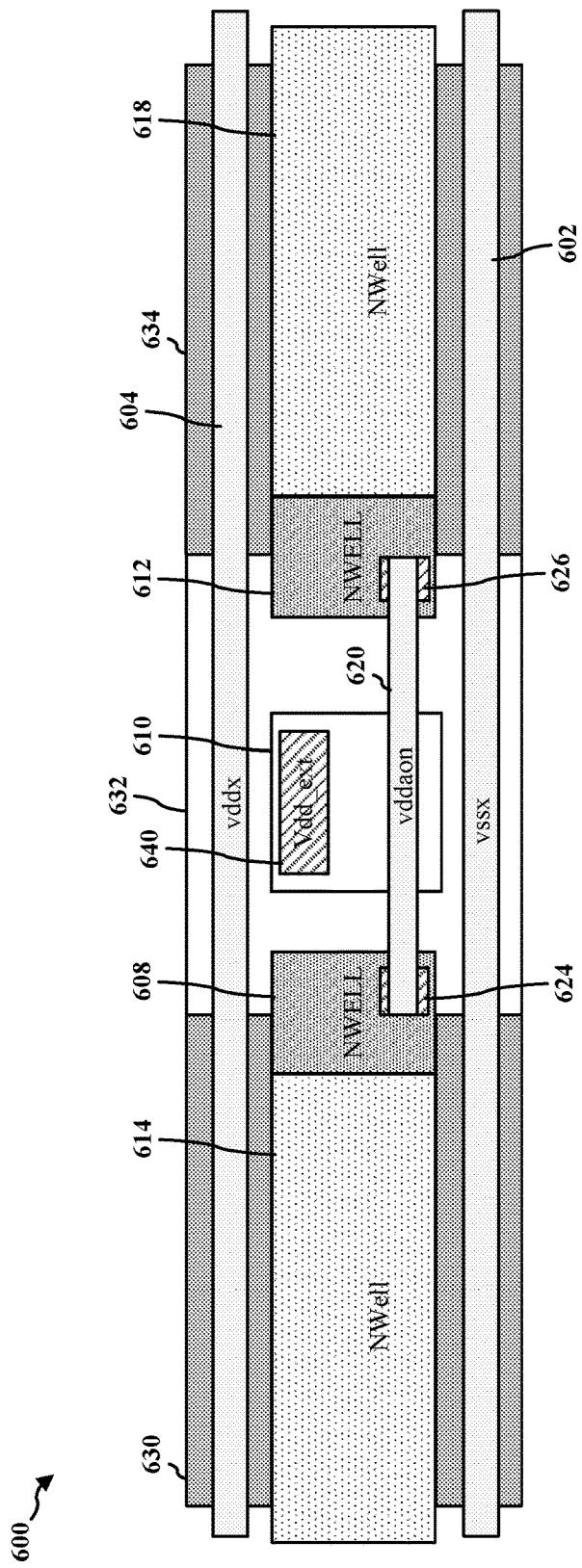
FIG. 6 is a diagram illustrating a layout view of a split n-well cell placed between two merged n-well cells.

FIG. 6 is a diagram 600 illustrating a layout view of a split n-well cell 632 placed between two merged n-well cells 630 and 634. In one configuration, the split n-well cell 632 may be the split n-well cell 406, 410, or 500 described above. As illustrated in FIG. 6, the split n-well cell 632 includes three separate n-wells 608, 610, and 612. The merged n-well cells 630 and 634 include n-wells 614 and 618, respectively. The n-well 614 of the merged n-well cell 630 is continuous with the n-well 608 of the split n-well cell 632. The n-well 618 of the merged n-well cell 634 is continuous with the n-well 612 of the split n-well cell 632.

A power rail 602 extend horizontally across the cells 630, 632, and 634. The power rail 602 may provide power to the cells 630, 632, 634 from a first voltage source (e.g., VSSX). A power rail 604 extends horizontally, and in parallel to the power rail 602, across the cells 630, 632, and 634. The power rail 604 may provide power to the cells 630, 632, and 634 from a second voltage source (e.g., VDDX). The second voltage source may have a higher voltage level than the first voltage source. In one configuration, the second voltage source may be the default switchable version (e.g., VDD_CX_SW) of an AON voltage source (e.g., VDD_CX) described above with reference to FIGS. 3 and 4. The n-well 610 may have a power pin 640 that is coupled to a third voltage source (e.g., VDD_EXT). The third voltage source may have a different voltage level than the second voltage source. The third voltage source may have a higher voltage level than the first voltage source. In one configuration, the third voltage source may be the non-default voltage source (e.g., VDD_MX) described above with reference to FIGS. 3 and 4.

As illustrated in FIG. 6, the n-well 608 has a power pin 624. Therefore, instead of the n-well 608 being internally tapped to the second voltage source (e.g., VDDX) through the power rail 604, the n-well 608 may tap to an AON voltage source (e.g., VDD_CX) through the power pin 624. In one configuration, the AON voltage source may be an AON version of the second voltage source. Similarly, the n-well 612 has a power pin 626. Therefore, instead of the n-well 612 being internally tapped to the second voltage source through the power rail 604, the n-well 612 may tap to the AON voltage source through the power pin 626. In one configuration, the power pins 624 and 626 may be the power pins 524 and 526, respectively, described above with reference to FIG. 5.

In one configuration, an interconnect 620 may connect the power pins 624 and 626. The interconnect 620 may be a metal 2 (M2) layer interconnect. The interconnect 620 may propagate power from the n-well 608 to the n-well 612, or vice versa. As a result, if the n-well 608 is coupled to the AON voltage source, e.g., through routing the AON voltage source to the power pin 624 or through the n-well 614, the n-well 612 may be able to couple to the AON voltage source through the interconnect 620. Similarly, if the n-well 612 is coupled to the AON voltage source, e.g., through routing the AON voltage source to the power pin 626 or through the n-well 618, the n-well 608 may be able to couple to the AON voltage source through the interconnect 620.

There may be a large number of split n-well cells in a merged n-well circuit block. If the power pin (e.g., 624 or 626) of each of those split n-well cells is tapped to the AON voltage source, significant power routing congestion may result and the design may not even be possible to manufacture. In one configuration, the arrangement/structure of split n-well cells in a merged n-well circuit block disclosed in this disclosure ensures that the power routing congestion is minimal, the split n-well cells can safely abut with regular merged n-well cells, and the latch-up issue is resolved.

Figure 7:
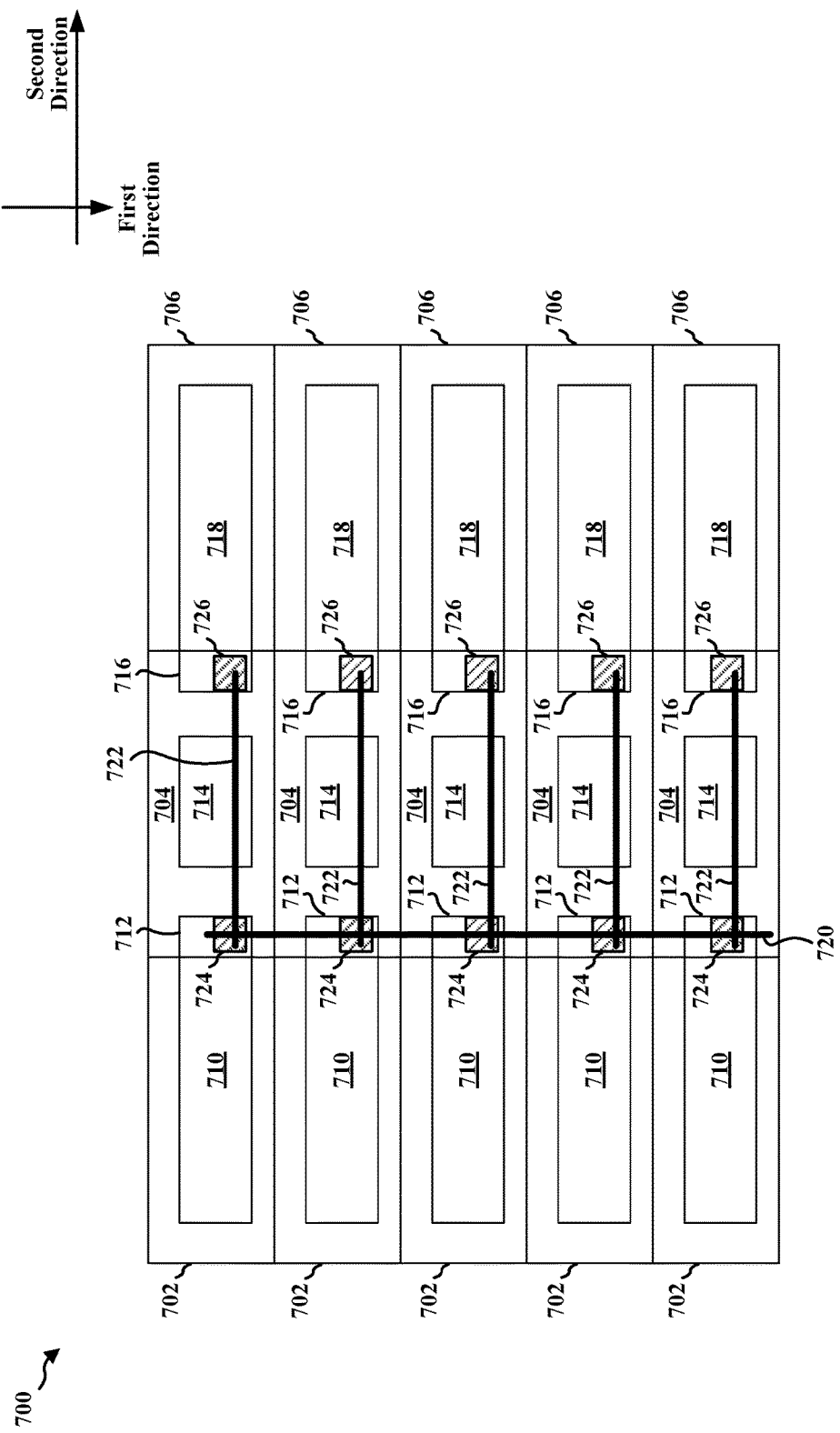
FIG. 7 is a diagram illustrating a layout view of multiple split n-well cells placed in a merged n-well circuit block.

FIG. 7 is a diagram illustrating a layout view of multiple split n-well cells 704 placed in a merged n-well circuit block 700. In one configuration, each of the split n-well cells 704 may be the split n-well cell 406, 410, 500, or 632 described above. As illustrated in FIG. 7, the split n-well cells 704 are adjacent to each other in a first direction (e.g., vertical direction in FIG. 7). Each split n-well cell 704 includes three separate n-wells 712, 714, and 716. The split n-well cells 704 are placed between a first set of merged n-well cells 702 and a second set of merged n-well cells 706. Therefore, the split n-well cells 704 are adjacent to the first set of merged n-well cells 702 and the second set of merged n-well cells 706 in a second direction (e.g., the horizontal direction in FIG. 7) orthogonal to the first direction. Each merged n-well cells 702 includes an n-well 710. Each n-well 710 of a merged n-well cell 702 is continuous with the n-well 712 of a split n-well cell 704 adjacent to the merged n-well cell 702. Each merged n-well cell 706 includes an n-well 718. Each n-well 718 of a merged n-well cell 706 is continuous with the n-well 716 of a split n-well cell 704 adjacent to the merged n-well cell 706.

Each n-well 712 may have a power pin 724 that may be coupled to an AON voltage source (e.g., VDD_CX). Similarly, each n-well 716 may have a power pin 726 that may be coupled to the AON voltage source. In one configuration, the power pin 724 may be the power pin 524 or 624 described above in FIGS. 5 and 6, and the power pin 726 may be the power pin 526 or 626 described above in FIGS. 5 and 6.

In one configuration, the split n-well cells 704 may be aligned in the first direction with the power pin 724 of each split n-well cell 704 aligned in the first direction. In such a configuration, an interconnect 720 may extend across the merged n-well circuit block 700 in the first direction and short all the power pins 724. In one configuration, the interconnect 720 may be a metal 3 (M3) layer interconnect. In one configuration, the interconnect 720 may tap to the AON voltage source at between M3 layer and metal 8 (M8) layer at larger intervals (e.g., every n cells, n>1) because current requirement is not significant for this path.

In one configuration, an interconnect 722 may extend across a split n-well cell 704 in the second direction and connect the power pins 724 and 726. The interconnect 722 may be a M2 layer interconnect. In one configuration, the interconnect 722 may be the interconnect 620 described above with reference to FIG. 6. The interconnect 722 may propagate power from the n-well 712 to the n-well 716, or vice versa. As a result, if the n-well 712 is coupled to the AON voltage source, e.g., through the interconnect 720, the n-well 716 may be able to couple to the AON voltage source through the interconnect 722. Similarly, if the n-well 716 is coupled to the AON voltage source, e.g., through routing the AON voltage source to the power pin 726 or through the n-well 718, the n-well 712 may be able to couple to the AON voltage source through the interconnect 722.

Figure 8:
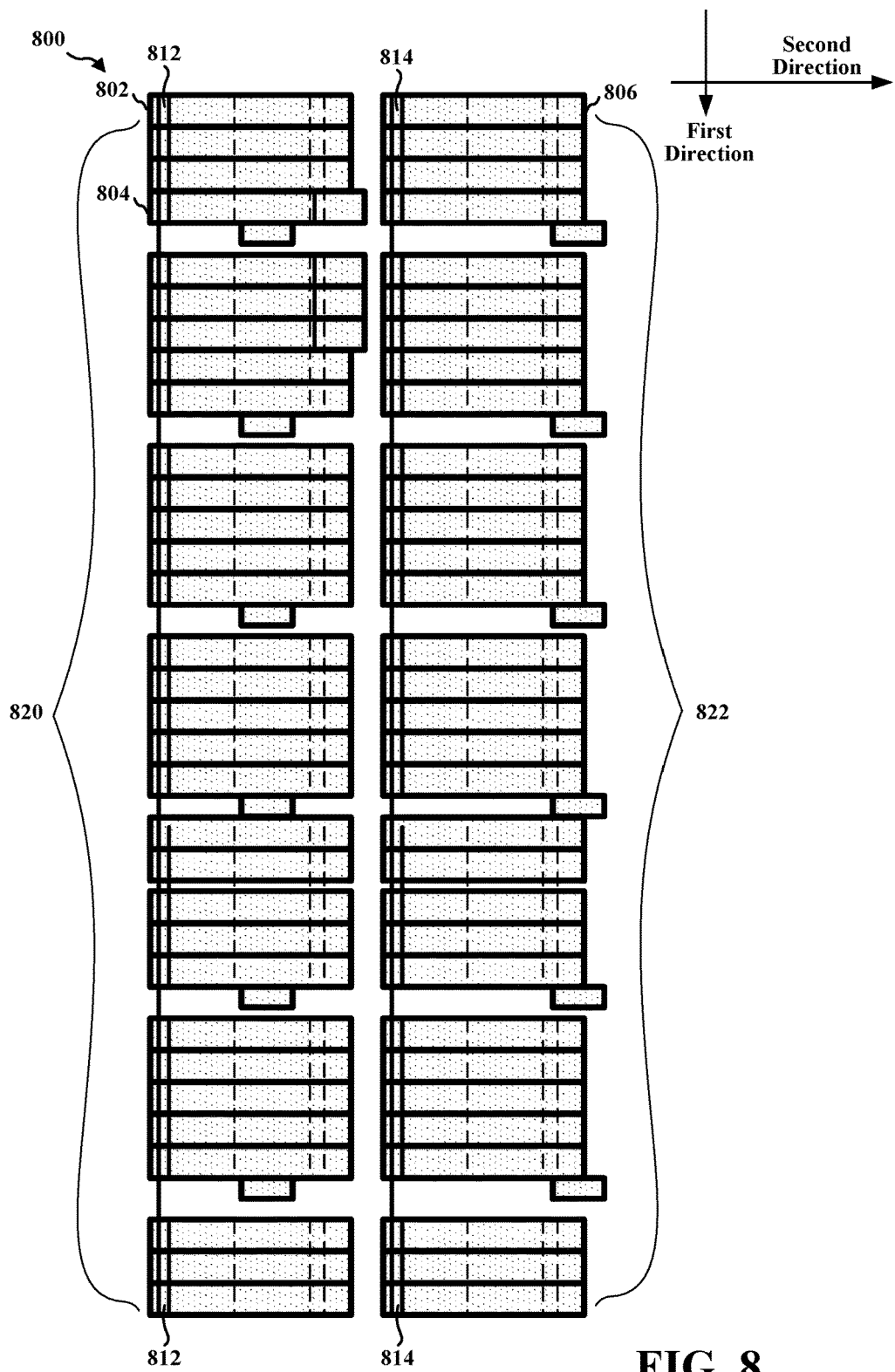
FIG. 8 is a diagram illustrating another layout view of multiple split n-well cells placed in a merged n-well circuit block.

FIG. 8 is a diagram illustrating another layout view of multiple split n-well cells placed in a merged n-well circuit block 800. As illustrated in FIG. 8, the merged n-well circuit block 800 includes multiple rows of cells. In one configuration, the merged n-well circuit block 800 may include a first set of rows 820 and a second set of rows 822. The first set of rows 820 may be adjacent to each other in a first direction (e.g., the vertical direction in FIG. 8). The second set of rows 822 may be adjacent to each other in the first direction. In one configuration, each row (e.g., row 802, 804, or 814) of the merged n-well circuit block 800 may include a merged n-well cell 702, a split n-well cell 704, and a merged n-well cell 706 (not shown) adjacent to each other in a second direction (e.g., the horizontal direction in FIG. 8) orthogonal to the first direction, as described above with reference to FIG. 7. In one configuration, each row may have different length. For example, the row 802 has a different length than the row 804.

A split n-well of a row may have a power pin (not shown) that may be coupled to an AON voltage source (e.g., VDD_CX). In one configuration, the power pin may be the power pin 524, 624, 724, 526, 626, or 726 described above. In one configuration, the split n-well cells of each row of the first set of rows 820 may be aligned in the first direction with a power pin of each split n-well cell aligned in the first direction. In such a configuration, an interconnect 812 may extend across the first set of rows 820 in the first direction and short all the power pins. In one configuration, the interconnect 812 may be a M3 layer interconnect. In one configuration, the interconnect 812 may tap to the AON voltage source at between M3 layer and M8 layer at larger intervals (e.g., every n cells, n>1) because current requirement is not significant for this path. Similarly, the split n-well cells of each row of the second set of rows 822 may be aligned in the first direction with a power pin of each split n-well cell aligned in the first direction. In such a configuration, an interconnect 814 may extend across the second set of rows 822 in the first direction and short all the power pins. In one configuration, the interconnect 814 may be a M3 layer interconnect. In one configuration, the interconnect 814 may tap to the AON voltage source at between M3 layer and M8 layer at larger intervals (e.g., every n cells, n>1) because current requirement is not significant for this path.

In one configuration, the merged n-well circuit block described above in FIGS. 1-8 is a MOS device. The MOS device may include a first set of cells (e.g., the merged n-well cells 702) adjacent to each other in a first direction (e.g., the vertical direction in FIGS. 7 and 8). Each of the first set of cells may include an n-well (e.g., 710) coupled to a first voltage source (e.g., the AON voltage source VDD_CX).

The MOS device may include a second set of cells (e.g., the split n-well cells 704) adjacent to each other in the first direction (e.g., the vertical direction in FIGS. 7 and 8) and adjacent to the first set of cells (702) in a second direction (e.g., the horizontal direction in FIGS. 7 and 8) orthogonal to the first direction. The second set of cells (704) each may include a first n-well (e.g., 712), a second n-well (e.g., 714), and a third n-well (e.g., 716) separated from each other. Each first n-well (712) may be continuous with the n-well (e.g., 710) of an adjacent cell of the first set of cells (702). The second n-well (714) may be between the first n-well (712) and the third n-well (716). The first n-well (712) and the third n-well (716) may be coupled to the first voltage source. The second n-well may be coupled to a second voltage source (e.g., the non-default voltage source VDD_MX) different than the first voltage source.

The MOS device may include an interconnect (e.g., 720) extending in the first direction (e.g., the vertical direction in FIGS. 7 and 8) in the second set of cells (704). The interconnect (720) may provide the first voltage source to the first n-well (712) of each of the second set of cells (704).

In one configuration, the first n-well (712) is adjacent to a first side of each cell of the second set of cells (704) and the third n-well (716) is adjacent to a second side of each cell of the second set of cells (704). The second side being opposite the first side. In one configuration, the second set of cells (704) is aligned in the first direction (e.g., the vertical direction in FIGS. 7 and 8) on the first side. In one configuration, the interconnect (720) extends in the first direction (e.g., the vertical direction in FIGS. 7 and 8) over the first n-well (712) adjacent to the first side.

In one configuration, each cell of the first set of cells (702) includes a plurality of p-type MOS (pMOS) transistors within a region of the n-well (710). A subset of the plurality of pMOS transistors may be powered by a switchable voltage source (e.g., the switchable voltage source VDD_CX_SW). In one configuration, the interconnect (720) may be on a M3 layer and is a M3 layer interconnect.

In one configuration, the MOS device may further include a second interconnect (e.g., 722) extending in the second direction (e.g., the horizontal direction in FIGS. 7 and 8) in each cell of the second set of cells (704). The second interconnect (722) may couple the first voltage source from the first n-well (712) to the third n-well (716) in each of the second set of cells (704).

In one configuration, the MOS device may further include a third set of cells (e.g., the merged n-well cells 706) adjacent to each other in the first direction (e.g., the vertical direction in FIGS. 7 and 8). The third set of cells (706) may be adjacent to the second set of cells (704) in the second direction (e.g., the horizontal direction in FIGS. 7 and 8). Each of the third set of cells (706) may include an n-well (e.g., 718) that is continuous with the third n-well (e.g., 716)

of an adjacent cell of the second set of cells (704). Each n-well (718) of the third set of cells (706) may be coupled to the first voltage source through the third n-well (716) of the corresponding adjacent cell of the second set of cells (704). In one configuration, transistors in each cell of the first set of cells (702), the second set of cells (704), and third set of cells (706) may be fin field-effect transistors (FinFets).

FIG. 9 is a flowchart 900 of a method of operating a MOS device. The method may be performed by a MOS device (e.g., the merged n-well circuit block described above with reference to FIGS. 1-8). At 902, the device provides a first voltage (e.g., the AON voltage from VDD_CX) to a first set of cells (e.g., the merged n-well cells 702) adjacent to each other in a first direction (e.g., the vertical direction in FIG. 7). Each of the first set of cells includes an n-well (e.g., 710) provided with the first voltage.

At 904, the device provides the first voltage and a second voltage (e.g., the non-default voltage from VDD_MX) different from the first voltage to a second set of cells (e.g., the split n-well cells 704) adjacent to each other in the first direction and adjacent to the first set of cells in a second direction (e.g., the horizontal direction in FIG. 7) orthogonal to the first direction. The second set of cells each includes a first n-well (e.g., 712), a second n-well (e.g., 714), and a third n-well (e.g., 716) separated from each other. Each first n-well is continuous with the n-well (e.g., 710) of an adjacent cell of the first set of cells. The second n-well may be between the first n-well and the third n-well. The first n-well and the third n-well may be provided with the first voltage. The second n-well may be provided with the second voltage.

In one configuration, each cell of the first set of cells may include several pMOS transistors within a region of the n-well (e.g., 710). A subset of the pMOS transistors may be powered by a switchable voltage source (e.g., VDD_CX_SW).

At 906, the device may propagate the first voltage in an interconnect (e.g., the interconnect 720) extending in the first direction in the second set of cells. The interconnect my provide the first voltage (e.g., the AON voltage from VDD_CX) to the first n-well of each of the second set of cells.

In one configuration, the first n-well may be adjacent to a first side of each cell of the second set of cells and the third n-well may be adjacent to a second side of each cell of the second set of cells. The second side may be opposite the first side. In one configuration, the second set of cells may be aligned in the first direction on the first side. In one configuration, the interconnect may extend in the first direction over the first n-well adjacent to the first side. In one configuration, the interconnect may be on the M3 layer and be a M3 layer interconnect.

At 908, the device may optionally propagate the first voltage in a second interconnect (e.g., the interconnect 722) extending in the second direction in each cell of the second set of cells. The second interconnect may propagate the first voltage from the first n-well (e.g., 712) to the third n-well (e.g., 716) in each of the second set of cells.

At 910, the device may optionally provide the first voltage to a third set of cells (e.g., the merged n-well cells 706) adjacent to each other in the first direction. The third set of cells may be adjacent to the second set of cells in the second direction. Each of the third set of cells may include an n-well (e.g., 718) that is continuous with the third n-well (e.g., 716) of an adjacent cell of the second set of cells. Each n-well of the third set of cells may be provided with the first voltage (e.g., the AON voltage of VDD_CX) through the third n-well of the corresponding adjacent cell of the second set of cells.

In one configuration, transistors in each cell of the first, second, and third set of cells may be fin field-effect transistors (FinFets). A FinFET may also be referred to as a multiple gate field-effect transistor (FET) (MuGFET), a tri-gate FET, or a multi-gate FET. When two gates of a MuGFET are tied together, such a device may be referred to as a shorted-gate FinFET or tied-gate FinFET.

In one configuration, the merged n-well circuit block described above with reference to FIGS. 1-8 may be an apparatus for operating a MOS device.

In one configuration, the apparatus includes means for providing a first voltage to a first set of cells adjacent to each other in a first direction. Each of the first set of cells including an n-well provided with the first voltage. In one configuration, the means for providing a first voltage to a first set of cells adjacent to each other in a first direction may perform operations described above with reference to 902 of FIG. 9. In one configuration, the means for providing a first voltage to a first set of cells adjacent to each other in a first direction may be the merged n-well cells 702, the power pin 724 or 726, or the interconnect 720 or 722.

In one configuration, the apparatus includes means for providing the first voltage and a second voltage different from the first voltage to a second set of cells adjacent to each other in the first direction and adjacent to the first set of cells in a second direction orthogonal to the first direction. The second set of cells each may include a first n-well, a second n-well, and a third n-well separated from each other. Each first n-well may be continuous with the n-well of an adjacent cell of the first set of cells. The second n-well may be between the first n-well and the third n-well. The first n-well and the third n-well may be provided with the first voltage. The second n-well may be provided with the second voltage. In one configuration, the means for providing the first voltage and a second voltage different from the first voltage to a second set of cells adjacent to each other in the first direction and adjacent to the first set of cells in a second direction orthogonal to the first direction may perform operations described above with reference to 904 of FIG. 9. In one configuration, the means for providing the first voltage and a second voltage different from the first voltage to a second set of cells adjacent to each other in the first direction and adjacent to the first set of cells in a second direction orthogonal to the first direction may be the split n-well cells 704, the power pin 640, the power pin 724 or 726, or the interconnect 720 or 722.

In one configuration, the apparatus may include means for propagating the first voltage in an interconnect extending in the first direction in the second set of cells. The interconnect may provide the first voltage to the first n-well of each of the second set of cells. In one configuration, the means for propagating the first voltage in an interconnect extending in the first direction in the second set of cells may perform operations described above with reference to 906 of FIG. 9. In one configuration, the means for propagating the first voltage in an interconnect extending in the first direction in the second set of cells may be the interconnect 720.

In one configuration, the apparatus may include means for propagating the first voltage in a second interconnect extending in the second direction in each cell of the second set of cells. The second interconnect may propagate the first voltage from the first n-well to the third n-well in each of the second set of cells. In one configuration, the means for propagating the first voltage in a second interconnect extending in the second direction in each cell of the second set of cells may perform operations described above with reference to 908 of FIG. 9. In one configuration, the means for propagating the first voltage in a second interconnect extending in the second direction in each cell of the second set of cells may be the interconnect 722.

In one configuration, the apparatus may include means for providing the first voltage to a third set of cells adjacent to each other in the first direction. The third set of cells may be adjacent to the second set of cells in the second direction. Each of the third set of cells may include an n-well that is continuous with the third n-well of an adjacent cell of the second set of cells. Each n-well of the third set of cells may be provided with the first voltage through the third n-well of the corresponding adjacent cell of the second set of cells. In one configuration, the means for providing the first voltage to a third set of cells adjacent to each other in the first direction may perform operations described above with reference to 910 of FIG. 9. In one configuration, the means for providing the first voltage to a third set of cells adjacent to each other in the first direction may be the merged n-well cells 706, the power pin 724 or 726, or the interconnect 720 or 722.

As described supra with reference to FIGS. 1-9, an exemplary merged n-well circuit block using split n-well cells is provided. The merged n-well circuit block may have a set of split n-well cells aligned in a first direction (e.g., the vertical direction in FIGS. 7 and 8) with a power pin of each split n-well cell aligned. The aligned power pins of the set of split n-well cells may be shorted to a first interconnect extending in the first direction and an AON voltage source may be provided to the set of split n-well cells through the interconnect. A second interconnect may extend across each split n-well cell to connect two power pins on two sides of split n-well cell to provide the AON voltage source from one merged n-well to another merged n-well. This arrangement/structure of split n-well cells in a merged n-well circuit block ensures that the power routing congestion is minimal, the split n-well cells can safely abut with regular merged n-well cells, and the latch-up issue is resolved.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A metal oxide semiconductor (MOS) device, comprising:
   a first set of cells adjacent to each other in a first direction, each of the first set of cells including an n-type well (n-well) coupled to a first voltage source;
   a second set of cells adjacent to each other in the first direction and adjacent to the first set of cells in a second direction orthogonal to the first direction, the second set of cells each including a first n-well, a second n-well, and a third n-well separated from each other, each first n-well being continuous with the n-well of an adjacent cell of the first set of cells and separated from the second n-well by a spacing, the second n-well being between the first n-well and the third n-well, the first n-well and the third n-well being coupled to the first voltage source, the second n-well being coupled to a second voltage source different than the first voltage source; and
   an interconnect extending in the first direction in the second set of cells, the interconnect providing the first voltage source to the first n-well of each of the second set of cells.

2. The MOS device of claim 1, wherein the first n-well is adjacent to a first side of each cell of the second set of cells and the third n-well is adjacent to a second side of each cell of the second set of cells, the second side being opposite the first side, and wherein the second set of cells is aligned in the first direction on the first side.

3. The MOS device of claim 2, wherein the interconnect extends in the first direction over the first n-well adjacent to the first side.

4. The MOS device of claim 1, wherein each cell of the first set of cells includes a plurality of p-type MOS (pMOS) transistors within a region of the n-well, and a subset of the plurality of pMOS transistors is powered by a switchable voltage source.

5. The MOS device of claim 1, wherein the interconnect is on a metal 3 (M3) layer and is a M3 layer interconnect.

6. The MOS device of claim 1, further comprising a second interconnect extending in the second direction in each cell of the second set of cells, the second interconnect coupling the first voltage source from the first n-well to the third n-well in each of the second set of cells.

7. The MOS device of claim 1, further comprising a third set of cells adjacent to each other in the first direction, the third set of cells being adjacent to the second set of cells in the second direction, each of the third set of cells including an n-well that is continuous with the third n-well of an adjacent cell of the second set of cells, each n-well of the third set of cells being coupled to the first voltage source through the third n-well of the corresponding adjacent cell of the second set of cells.

8. The MOS device of claim 1, wherein transistors in each cell of the first set of cells are fin field-effect transistors (FinFets).

9. A method of operating a metal oxide semiconductor (MOS) device, comprising:
providing a first voltage to a first set of cells adjacent to each other in a first direction, each of the first set of cells including an n-type well (n-well) provided with the first voltage;
providing the first voltage and a second voltage different from the first voltage to a second set of cells adjacent to each other in the first direction and adjacent to the first set of cells in a second direction orthogonal to the first direction, the second set of cells each including a first n-well, a second n-well, and a third n-well separated from each other, each first n-well being continuous with the n-well of an adjacent cell of the first set of cells and separated from the second n-well by a spacing, the second n-well being between the first n-well and the third n-well, the first n-well and the third n-well being provided with the first voltage, the second n-well being provided with the second voltage; and
propagating the first voltage in an interconnect extending in the first direction in the second set of cells, the interconnect providing the first voltage to the first n-well of each of the second set of cells.

10. The method of claim 9, wherein the first n-well is adjacent to a first side of each cell of the second set of cells and the third n-well is adjacent to a second side of each cell of the second set of cells, the second side being opposite the first side, and wherein the second set of cells is aligned in the first direction on the first side.

11. The method of claim 10, wherein the interconnect extends in the first direction over the first n-well adjacent to the first side.

12. The method of claim 9, wherein each cell of the first set of cells includes a plurality of p-type MOS (pMOS) transistors within a region of the n-well, and a subset of the plurality of pMOS transistors is powered by a switchable voltage source.

13. The method of claim 9, wherein the interconnect is on a metal 3 (M3) layer and is a M3 layer interconnect.

14. The method of claim 9, further comprising propagating the first voltage in a second interconnect extending in the second direction in each cell of the second set of cells, the second interconnect propagating the first voltage from the first n-well to the third n-well in each of the second set of cells.

15. The method of claim 9, further comprising providing the first voltage to a third set of cells adjacent to each other in the first direction, the third set of cells being adjacent to the second set of cells in the second direction, each of the third set of cells including an n-well that is continuous with the third n-well of an adjacent cell of the second set of cells, each n-well of the third set of cells being provided with the first voltage through the third n-well of the corresponding adjacent cell of the second set of cells.

16. The method of claim 9, wherein transistors in each cell of the first set of cells are fin field-effect transistors (FinFets).

17. An apparatus for operating a metal oxide semiconductor (MOS) device, comprising:
means for providing a first voltage to a first set of cells adjacent to each other in a first direction, each of the first set of cells including an n-type well (n-well) provided with the first voltage;
means for providing the first voltage and a second voltage different from the first voltage to a second set of cells adjacent to each other in the first direction and adjacent to the first set of cells in a second direction orthogonal to the first direction, the second set of cells each including a first n-well, a second n-well, and a third n-well separated from each other, each first n-well being continuous with the n-well of an adjacent cell of the first set of cells and separated from the second n-well by a spacing, the second n-well being between the first n-well and the third n-well, the first n-well and the third n-well being provided with the first voltage, the second n-well being provided with the second voltage; and
means for propagating the first voltage in an interconnect extending in the first direction in the second set of cells, the interconnect providing the first voltage to the first n-well of each of the second set of cells.

18. The apparatus of claim 17, wherein the first n-well is adjacent to a first side of each cell of the second set of cells and the third n-well is adjacent to a second side of each cell of the second set of cells, the second side being opposite the first side, and wherein the second set of cells is aligned in the first direction on the first side.

19. The apparatus of claim 18, wherein the interconnect extends in the first direction over the first n-well adjacent to the first side.

20. The apparatus of claim 17, wherein each cell of the first set of cells includes a plurality of p-type MOS (pMOS) transistors within a region of the n-well, and a subset of the plurality of pMOS transistors is powered by a switchable voltage source.

21. The apparatus of claim 17, wherein the interconnect is on a metal 3 (M3) layer and is a M3 layer interconnect.

22. The apparatus of claim 17, further comprising means for propagating the first voltage in a second interconnect extending in the second direction in each cell of the second set of cells, the second interconnect propagating the first voltage from the first n-well to the third n-well in each of the second set of cells.

23. The apparatus of claim 17, further comprising means for providing the first voltage to a third set of cells adjacent to each other in the first direction, the third set of cells being adjacent to the second set of cells in the second direction, each of the third set of cells including an n-well that is continuous with the third n-well of an adjacent cell of the second set of cells, each n-well of the third set of cells being provided with the first voltage through the third n-well of the corresponding adjacent cell of the second set of cells.

24. The apparatus of claim 17, wherein transistors in each cell of the first set of cells are fin field-effect transistors (FinFets).

* * * * *